United States Patent
Peng et al.

(10) Patent No.: US 11,322,624 B2
(45) Date of Patent: May 3, 2022

(54) DETECTION APPARATUS, FABRICATION METHOD THEREOF, ARRAY SUBSTRATE, AND DISPLAY APPARATUS

(71) Applicants: HEFEI XINSHENG OPTOELECTRONICS TECHNOLOGY CO., LTD., Anhui (CN); BOE TECHNOLOGY GROUP CO., LTD., Beijing (CN)

(72) Inventors: Rui Peng, Beijing (CN); Wenbin Jia, Beijing (CN); Zhijie Ye, Beijing (CN); Yue Hu, Beijing (CN); Xiang Wan, Beijing (CN); Xinxin Wang, Beijing (CN); Yulin Wang, Beijing (CN)

(73) Assignees: HEFEI XINSHENG OPTOELECTRONICS TECHNOLOGY CO., LTD, Anhui (CN); BOE TECHNOLOGY GROUP CO., LTD., Beijing (CN)

( * ) Notice: Subject to any disclaimer, the term of this patent is extended or adjusted under 35 U.S.C. 154(b) by 180 days.

(21) Appl. No.: 16/346,956

(22) PCT Filed: Nov. 22, 2018

(86) PCT No.: PCT/CN2018/116939
§ 371 (c)(1),
(2) Date: May 2, 2019

(87) PCT Pub. No.: WO2019/101133
PCT Pub. Date: May 31, 2019

(65) Prior Publication Data
US 2020/0266302 A1 Aug. 20, 2020

(30) Foreign Application Priority Data
Nov. 24, 2017 (CN) .......................... 201711190037.5

(51) Int. Cl.
*H01L 29/84* (2006.01)
*H01L 27/32* (2006.01)

(52) U.S. Cl.
CPC .......... *H01L 29/84* (2013.01); *H01L 27/3225* (2013.01)

(58) Field of Classification Search
CPC ....... H01L 27/3225; H01L 27/12–1255; H01L 27/1259–1296; H01L 27/32–3274;
(Continued)

(56) References Cited

U.S. PATENT DOCUMENTS

| 4,519,678 A | 5/1985 | Komatsubara et al. |
| 8,272,276 B2 * | 9/2012 | Gorjanc .................. G01L 1/146 73/862.046 |

(Continued)

FOREIGN PATENT DOCUMENTS

| CN | 1651985 A | 8/2005 |
| CN | 102856395 A | 1/2013 |

(Continued)

OTHER PUBLICATIONS

Office Action dated Nov. 6, 2 019, issued in counterpart CN Application No. 201711190037.5, with English translation (23 pages).

(Continued)

*Primary Examiner* — Natalia A Gondarenko
(74) *Attorney, Agent, or Firm* — WHDA, LLP

(57) ABSTRACT

The present disclosure is related to a detection apparatus. The detection apparatus may include a gate insulating layer. The gate insulating layer may include at least a first layer and a second layer opposite the first layer. A plurality of protruding structures may be provided on a surface of the first layer facing the second layer and/or a surface of the second layer facing the first layer. The first layer and the (Continued)

second layer of the gate insulating layer may be connected through the protruding structures.

13 Claims, 7 Drawing Sheets

(58) Field of Classification Search
CPC .......... H01L 29/66742; H01L 29/4908; H01L 29/28282; H01L 29/66833; H01L 29/792–7926; H01L 29/4232; H01L 29/4234–42352; H01L 29/42384; H01L 29/42388; H01L 29/458; H01L 29/41733; H01L 29/43; H01L 29/7843; H01L 29/7856; H01L 29/786; H01L 29/42316; H01L 29/84; H01L 21/823462; H01L 21/823857; G06F 3/0414; G06F 3/047; G01L 9/0051; G01K 7/16
USPC ....... 257/26, 254, 324; 438/17, 50, 478, 287
See application file for complete search history.

(56) References Cited

U.S. PATENT DOCUMENTS

| | | | |
|---|---|---|---|
| 9,291,513 B2 * | 3/2016 | Lee | .......................... H01L 29/78 |
| 2009/0199648 A1 * | 8/2009 | Sung | ...................... G01L 9/0098 73/754 |
| 2013/0001556 A1 | 1/2013 | Hu et al. | |
| 2013/0037780 A1 * | 2/2013 | Kivioja | .................. G01L 1/2293 257/26 |
| 2014/0094003 A1 * | 4/2014 | Daniel | .............. H01L 21/02288 438/151 |
| 2017/0000358 A1 * | 1/2017 | Bae | .......................... G01K 7/16 |
| 2018/0188873 A1 | 7/2018 | Cheng et al. | |
| 2020/0141818 A1 * | 5/2020 | Bao | .......................... H01G 4/33 |
| 2021/0024674 A1 * | 1/2021 | Yahagi | .................... C08L 33/00 |

FOREIGN PATENT DOCUMENTS

| | | |
|---|---|---|
| CN | 103490010 A | 1/2014 |
| CN | 105628262 A | 6/2016 |
| CN | 106066224 A | 11/2016 |
| CN | 107946369 A | 4/2018 |

OTHER PUBLICATIONS

International Search Report dated Mar. 1, 2019, issued in counterpart application No. PCT/CN2018/116939. (10 pages).

* cited by examiner (1)

DETECTION APPARATUS, FABRICATION METHOD THEREOF, ARRAY SUBSTRATE, AND DISPLAY APPARATUS

CROSS-REFERENCE TO RELATED APPLICATIONS

This application claims benefit of the filing date of Chinese Patent Application No. 201711190037.5 filed on Nov. 24, 2017, the disclosure of which is hereby incorporated in its entirety by reference.

TECHNICAL FIELD

This disclosure relates to a detection technology, in particular, to a detection apparatus, a fabrication method thereof, an array substrate, and a display apparatus.

BACKGROUND

Thin film transistors (TFT) are thin film types of semiconductor switching apparatuses. They are widely applied in the fields of display technology such as liquid crystal display technology and organic light-emitting diode display technology, integrated circuit technology, and the like. The TFTs are used in both Liquid Crystal Display (LCD) apparatuses and Organic Light Emitting Diode (OLED) display apparatuses as control switches. In the TFT-LCD apparatuses, TFT field effect transistors are used. Generally, the TFT includes a gate electrode, a source electrode, a drain electrode, an active layer, and the like. The TFT can be controlled to act as a switch through the gate electrode thereof. The electric potential of capacitor of the TFT changes according to an external input of a data electric signal to drive liquid crystals to deflect. As such, an image or a picture is displayed on a screen.

BRIEF SUMMARY

Accordingly, one example of the present disclosure is a detection apparatus. The detection apparatus may include a gate insulating layer comprising at least a first layer and a second layer opposite the first layer. A plurality of protruding structures may be provided on a surface of the first layer facing the second layer or a surface of the second layer facing the first layer, and the first layer and the second layer of the gate insulating layer may be connected through the protruding structures.

Optionally, the detection apparatus further includes a substrate; a gate electrode on the substrate; a semiconductor layer; a source electrode; and a drain electrode. The gate insulating layer is between the semiconductor layer and the gate electrode, and the source electrode and the drain electrode are respectively connected with the semiconductor layer.

Optionally, the protruding structures are provided on both the surface of the first layer facing the second layer and the surface of the second layer facing the first layer in the gate insulating layer.

Optionally, a cross section of each of the plurality of the protruding structures in a plane perpendicular to the substrate has a triangular shape.

Optionally, a cross section of each of the plurality of the protruding structures in a plane perpendicular to the substrate is an arc-shaped protruding structure formed between two adjacent arcs.

Optionally, a plurality of microspheres are provided between the first layer and the second layer of the gate insulating layer, and the first layer and the second layer are connected through the protruding structures and the microspheres.

Optionally, a plurality of microspheres are provided between the first layer and the second layer of the gate insulating layer, the protruding structures provided on both the surface of the first layer facing the second layer and the surface of the second layer facing the first layer in the gate insulating layer form spaces accommodating the plurality of microspheres.

Optionally, the microspheres are made of polystyrene.

Optionally, a height of each of the plurality of the protruding structures is substantially equal to a diameter of each of the plurality of the microspheres.

Optionally, the protruding structures are made of an elastic polymer.

Optionally, the elastic polymer is selected from the group consisting of PS, PMMA, PS-P2VP block polymers, and mixtures thereof.

Another example of the present disclosure is a method of fabricating a detection apparatus. The method may include forming a gate electrode layer on a substrate; forming a first layer of a gate insulating layer on the gate electrode layer; forming a second layer of the gate insulating layer, a semiconductor layer, a source electrode, and a drain electrode on another substrate; forming a plurality of protruding structures on a surface of the first layer of the gate insulating layer opposite from the gate electrode layer; and transferring the second-layer of the gate insulating layer, the semiconductor layer, the source electrode, and the drain electrode onto the first layer of the gate insulating layer through a transfer printing process.

Optionally, before transferring the second-layer of the gate insulating layer, the semiconductor layer, the source electrode, and the drain electrode to the first layer of the gate insulating layer through a transfer printing process, the method further comprises forming a plurality of protruding structures on a surface of the second layer of the gate insulating layer opposite from the semiconductor layer.

Optionally, the plurality of protruding structures are formed on the surface of the first layer of the gate insulating layer opposite from the gate electrode layer and/or the surface of the second layer of the gate insulating layer opposite from the semiconductor layer are formed by a nano-imprinting process.

Optionally, after forming the protruding structures on the first layer of the gate insulating layer and before transferring the second layer of the gate insulating layer, the semiconductor layer, the source electrode, and the drain electrode onto the first layer of the gate insulating layer through a transfer printing process, the method further comprises coating a plurality of microspheres between the protruding structures on the first layer of the gate insulating layer. A cross section of each of the plurality of the protruding structures in a plane perpendicular to the substrate is an arc-shaped protruding structure formed between two adjacent arcs.

Optionally, a height of each of the plurality of the protruding structures is substantially equal to a diameter of each of the plurality of the microspheres.

Another example of the present disclosure is an array substrate. The array substrate may include the detection apparatus according to one embodiment of the present disclosure.

Another example of the present disclosure is a display apparatus. The display apparatus may include the array substrate according to one embodiment of the present disclosure.

BRIEF DESCRIPTION OF THE DRAWINGS

The subject matter which is regarded as the disclosure is particularly pointed out and distinctly claimed in the claims at the conclusion of the specification. The foregoing and other objects, features, and advantages of the disclosure are apparent from the following detailed description taken in conjunction with the accompanying drawings in which:

DETAILED DESCRIPTION

The present disclosure will be described in further detail with reference to the accompanying drawings and embodiments in order to provide a better understanding by those skilled in the art of the technical solutions of the present disclosure. Throughout the description of the disclosure, reference is made to FIGS. 1-7.

In the description of the present disclosure, the meaning of "plural" is two or more unless otherwise specifically and specifically defined.

In the description of the specification, references made to the teen "one embodiment," "some embodiments," "exemplary embodiments," "example," "specific example," "some examples" and the like are intended to refer that specific features and structures, materials or characteristics described in connection with the embodiment or example that are included in at least one embodiment or example of the present disclosure. The schematic expression of the terms does not necessarily refer to the same embodiment or example. Moreover, the specific features, structures, materials or characteristics described may be included in any suitable manner in any one or more embodiments or examples.

In addition, the terms "first" and "second" in the present disclosure are for illustration purposes only and are not to be construed as indicating or implying relative importance or implied reference to the quantity of indicated technical features. Thus, features defined by the terms first and "second" may explicitly or implicitly include one or more of the features. In the description of the present disclosure, the meaning of "plural" is two or more unless otherwise specifically and specifically defined.

For the TFTs, on one hand, the effect of switching can be realized through change of control signals of the gate electrodes. On the other hand, the change of the capacitance itself can also influence current passing through the source and drain electrodes of the TFT. Currently, most of the applications of the TFTs utilize only the switch characteristics of the TFTs. Therefore, the function of TFT is limited, and the advantages and characteristics of the TFTs cannot be fully utilized.

A TFT having a gate insulating layer and being capable of changing the capacitance of the TFT in response to a change of the gate electrode insulation layer is provided according to one embodiment of the present disclosure. The capacitance of the TFT can be changed based on a change of the gate electrode insulation layer. As such, the TFT can utilize a change of the capacitance of the TFT for purpose of detention or control. In some embodiments, the TFT is applied in a field of display or detection. The application field of the TFT is not limited.

Figure 1:
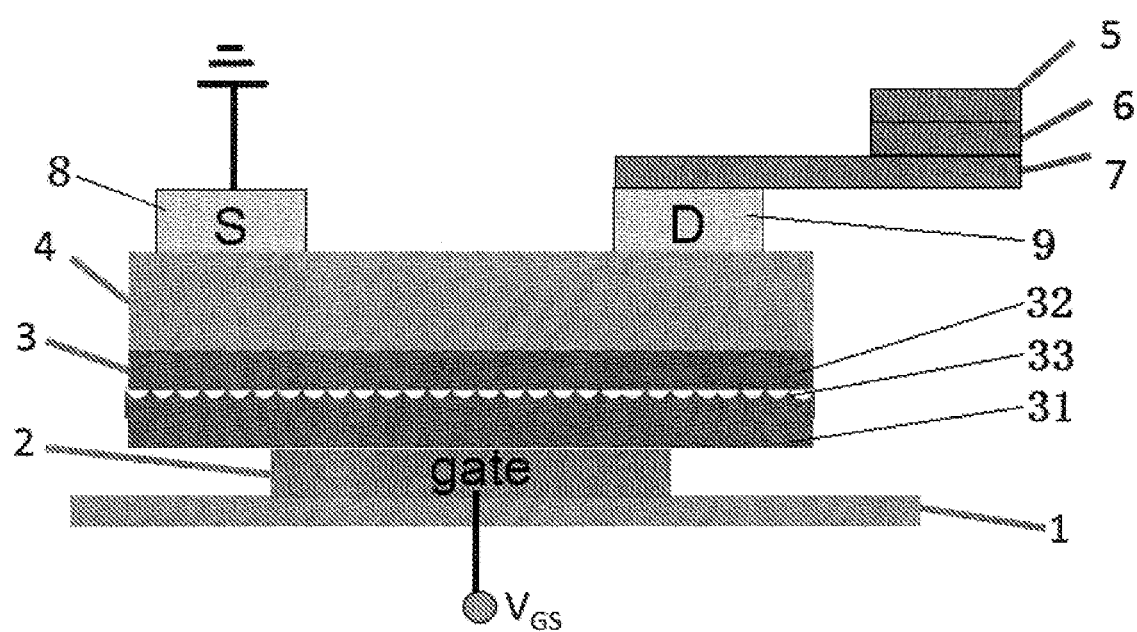
FIG. 1 is a schematic structural diagram of a detection apparatus according to an embodiment of the present disclosure.

FIG. 1 is a schematic structural diagram of a detection apparatus according to an embodiment of the present disclosure. The detection apparatus includes a substrate 1. The detection apparatus also includes a gate electrode 2, a gate electrode insulation layer 3, a semiconductor layer 4, a source electrode 8, and a drain electrode 9 which are sequentially arranged on the substrate 1. The semiconductor layer 4 and the gate electrode 2 are separated by the gate electrode insulation layer 3. The source electrode 8 and the drain electrode 9 are respectively connected with the semiconductor layer 4. The source electrode 8 and the drain electrode 9 are connected with the semiconductor layer 4 respectively. In some embodiments, the substrate 1 is a flexible substrate, such as polydimethylsiloxane (PDMS), polyimide (PI), a polyethylene terephthalate (PET) or a metal film and the like. In some embodiments, the gate electrode 2 is made of metal materials such as Aluminum (Al) and Molybdenum (Mo). The semiconductor layer 4 may be made of a semiconductor material with high mobility.

In some embodiments, the gate insulating layer 3 includes at least a first layer 31 and a second layer 32. The gate electrode 2 is arrange on a lower surface of the first layer 31. The semiconductor layer 4 is arranged on an upper surface of the second layer 32. The upper surface of the first layer 31 or the lower surface of the second layer 32 is provided with protruding structures 33, so that the first layer 31 and the second layer 32 are connected through the protruding structures 33. In some embodiments, the protruding structures 33 are made of an elastic polymer material. As such, when the detection apparatus is under an external pressure, the first layer 31 and the second layer 32 of the gate insulating layer 3 are compressed and getting closer to each other due to the effect of the pressure. As such, on one hand, the distance between the gate electrode 2 and the semiconductor layer 4 is reduced. On the other hand, because the protruding structures 33 are compressed, the contact area between the first layer 31 and the second layer 32 is increased and more air is discharged. As a result, the corresponding relative dielectric constant of the capacitance between the gate electrode 2 and the semiconductor layer 4 is increased. That is, the capacitance between the gate electrode 2 and the semiconductor layer 4 is increased due to the effect of the pressure. The change of the capacitance causes change of the current flowing from the source electrode to the drain electrode of the detection apparatus correspondingly. Consequently, more functions can be realized based on the change of the capacitance of the detection apparatus.

In some embodiments, when the detection apparatus is applied to a display-related apparatus such as an OLED, a first electrode 7, a light-emitting layer 6 and a second electrode 5 are further provided on the drain electrode 9, thereby realizing connection and control between the detection apparatus and related elements of the display apparatus.

According to the detection apparatus as mentioned above, in some embodiments, the gate insulating layer 3 located between the semiconductor layer and the gate electrode is composed of at least two layers or parts. Protruding structures are arranged between the at least two layers of the gate insulating layer 3, and the two layers of the gate insulating layer are physically connected through the protruding structure. In addition, the protruding structures are made of an elastic polymer material, and the distance between the semiconductor layer and the gate electrode can be changed through an external pressure. As such, the capacitance of the detection apparatus can be changed. As a result, new functions of the detection apparatus such as pressure detection or change of the current in the detection apparatus due to a pressure can be achieved based on the change of the capacitance of the detection apparatus.

In other embodiments, in the detection apparatus, microspheres are added between the two layers of the gate insulating layer 3. The microspheres can expand or contract according to change of temperature, thereby changing contact area between the two layers of the gate insulating layer and accordingly the relative dielectric constant of the detection apparatus. That is, the capacitance of the detection apparatus is changed based on the change of the temperature, thereby achieving temperature monitoring function or control function based on the temperature change. Therefore, by utilizing the characteristic capacitance change of the detection apparatus, functions of detection of pressure, temperature or the corresponding display control function based on changes of capacitance thereof can be provided, thereby identifying new applications of the detection apparatus.

In some embodiments, the protruding structures 33 are provided on a lower surface of the second layer 32. In other embodiments, both the upper surface of the first layer 31 and the lower surface of the second layer 32 are simultaneously provided with protruding structures 33 respectively. That is, the number and the position of the protruding structures 33 are not limited herein. The protruding structures 33 are used for changing the capacitance of the TFT through changing the gate insulating layer 3, thereby achieving more functional applications.

Figure 2:
FIG. 2 is a schematic view of a cross-section of a protruding structure according to an embodiment of the present disclosure.
Figure 3:
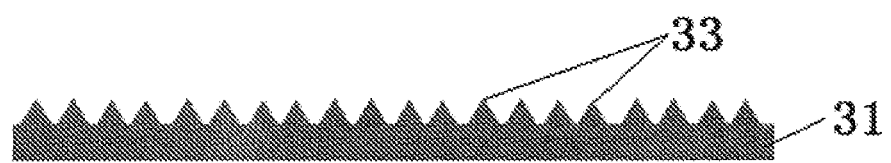
FIG. 3 is a schematic view of a cross-section of a protruding structure according to an embodiment of the present disclosure.

In some embodiments, a cross-section of the protruding structure 33 in a plane perpendicular to the substrate is of a triangular shape, as shown in FIG. 3. Alternatively, the cross-section of the protruding structure in a plane perpendicular to the substrate is of an arc-shaped protruding structure formed between two adjacent circular arcs, as shown in FIG. 2. FIGS. 2 and 3 respectively show cross-sectional schematic view of protruding structures provided by some embodiments of the present disclosure.

In some embodiments, as shown in FIG. 2, the protruding structure 33 adopts an arc-shape protruding structure having a cross section in a plane perpendicular to the substrate formed between two adjacent circular arcs. As such, the contact area of the first layer and the second layer is gradually increased under a pressure, thereby achieving a better control effect. Specifically, the arc-shaped protruding structure can be a protruding structure formed between two adjacent arc-shaped grooves, or can also be a protruding structure formed between two adjacent ball-shaped grooves.

In some embodiments, as shown in FIG. 3, the protruding structure 33 adopts a structure with a cross section of a triangular shape. As such, the distance and the contact area between the first layer and the second layer can be changed under the pressure. In addition, the corresponding resistance of the protruding structures increases as the pressure increases, thereby avoiding too large compression. As such, the protruding structures 33 are more stable and reliable.

The protruding structures shown in FIG. 2 and FIG. 3 are only two representative embodiments, and protruding structures of other shapes can also be used.

Figure 4:
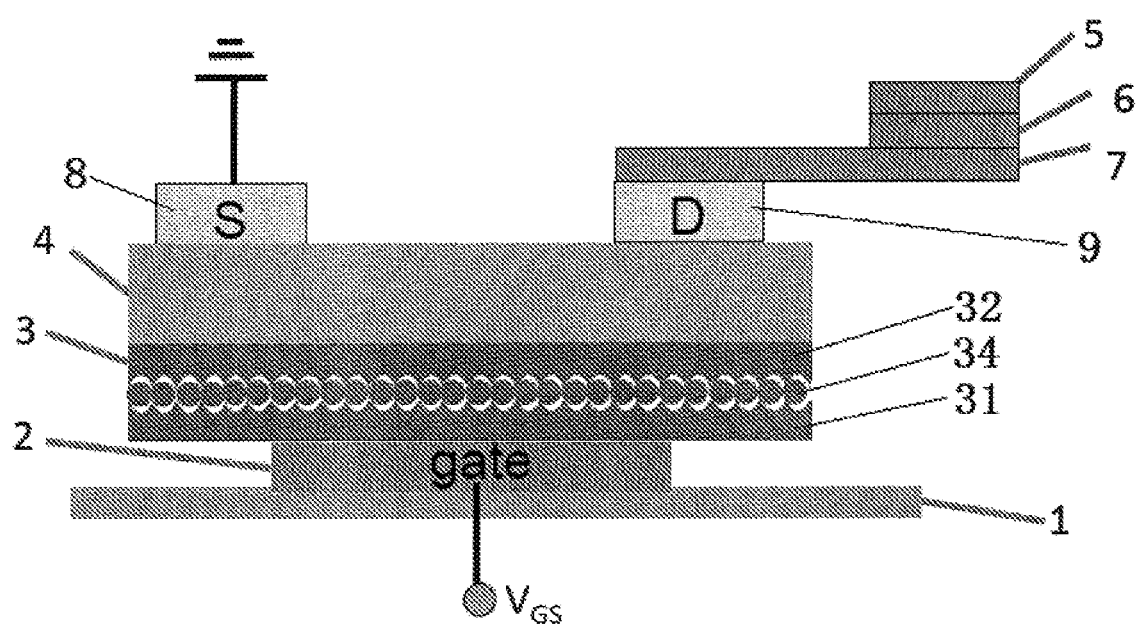
FIG. 4 is a schematic structural diagram of a detection apparatus according tics an embodiment of the present disclosure.

FIG. 4 is a schematic structural diagram of a detection apparatus according to an embodiment of the present disclosure. As shown in FIG. 4, microspheres 34 are arranged between the first layer 31 and the second layer 32. Both the upper surface of the first layer 31 and the lower surface of the second layer 32 are respectively provided with the protruding structures 33 which are matched with each other. The cross section of each of the protruding structures 33 in a plane perpendicular to the substrate is of an arc-shaped protruding structure formed between two adjacent arcs, so that space for accommodating the microspheres 33 is formed between the first layer 31 and the second layer 32. In some embodiments, the microspheres are made of nanoscale polystyrene (PS) material or other polymer materials.

As such, connections are achieved between the first layer 31 and the second layer 32 in the gate insulating layer through the protruding structures 33 and the microspheres. On one hand, when the detection apparatus receives an action of pressure, the capacitance between the gate electrode and the semiconductor layer can be correspondingly changed. On the other hand, when the height is not changed, the microspheres can expand as the temperature rises to increase the contact area between the first layer 31 and the second layer 32. As such, the relative dielectric constant corresponding to the capacitance between the gate electrode 2 and the semiconductor layer 4 is correspondingly increased, thereby changing the capacitance between the gate electrode 2 and the semiconductor layer 4. By adding microspheres 33 between the first layer 31 and the second layer 32, the detection apparatus can correspondingly change the capacitance of the capacitor based on a change of the temperature, thereby changing the corresponding current between the source electrode and the drain electrode based on the change of the temperature. When the detection apparatus is applied in the field of OLED displays, the capacitance of the detection apparatus can be changed based on the temperature of the detection apparatus. Accordingly, the brightness of the light source of the OLED display is correspondingly adjusted, thereby achieving the function of self-enhancement display.

In some embodiments, the microspheres are made of a nano-scale polystyrene (PS) material. The microspheres can also be made of other polymer materials as long as the microspheres are prepared according to the size of the protruding structures as mentioned above and can expand or contract according to the temperature. That is, the type of material of the microspheres is not limited herein.

In some embodiments of the present disclosure, all the elastic polymers are polymers with high elasticity and high dielectric constant. As such, the change of the capacitance of the detection apparatus can be more obvious based on the change of the pressure. That is, the stability and the reliability of the detection apparatus control can be improved.

In some embodiments, the elastic polymers can be one or a mixture of the following: polystyrene (PS), poly methyl methacrylate (PMMA), polystyrene-poly(2-vinyl pyridine) (PS-P2VP) block polymer.

Figure 5:
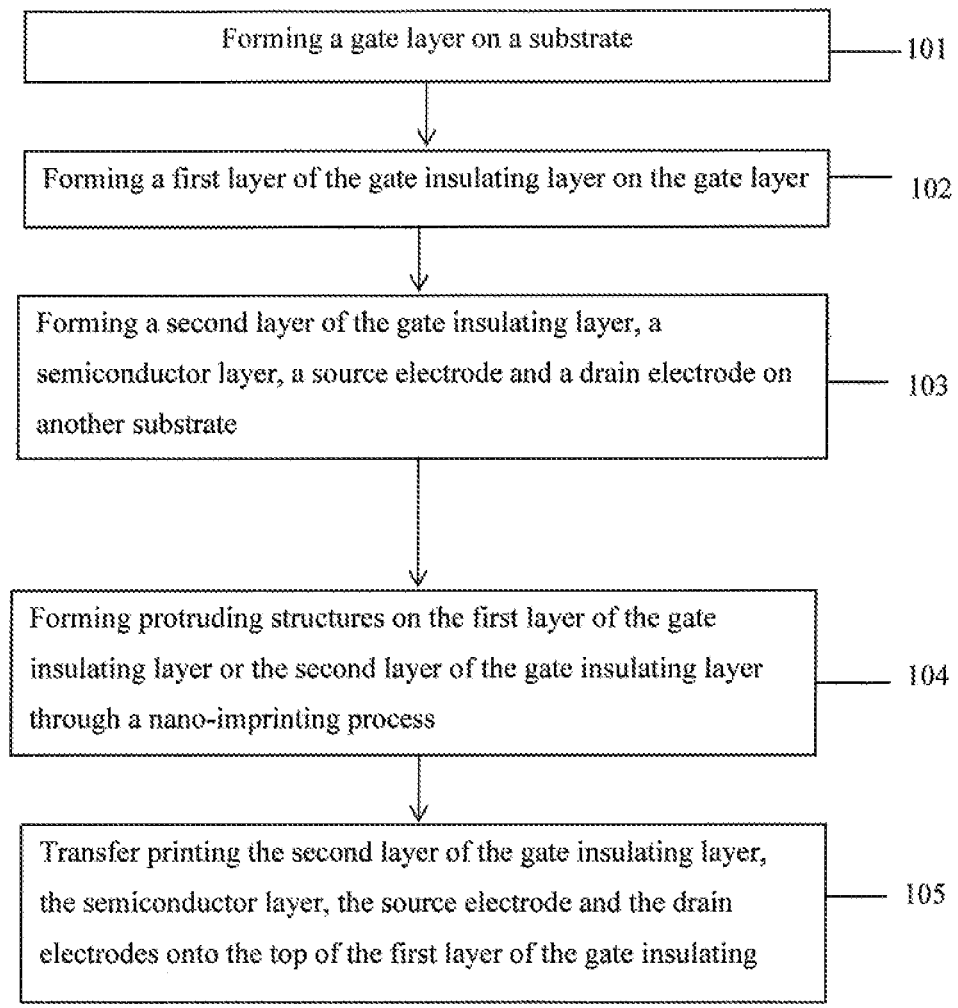
FIG. 5 is a flow chart of a method of fabricating a detection apparatus according to an embodiment of the present disclosure.

FIG. 5 is a flow chart of a method of fabricating a detection apparatus according to an embodiment of the present disclosure. As shown in FIG. 5, the method of fabricating the detection apparatus includes the following steps:

In step 101, a gate layer (gate) is formed on a substrate, the gate electrode of the TFT is electrically connected with an external control voltage $V_{GS}$ to achieve the corresponding control function.

In step 102, a first layer of the gate insulating layer is formed on the gate layer. In some embodiments, the first layer of the gate insulating layer can be obtained by a fabrication method such as coating or spin coating.

In step 103, a second layer of the gate insulating layer, a semiconductor layer, a source electrode and a drain electrode are formed on another substrate.

In step 104, protruding structures are formed on the first layer of the gate insulating layer or the second layer of the gate insulating layer through a nano-imprinting process. In some embodiments, the protruding structures are the same as the protruding structures in FIG. 2 or FIG. 3.

In step 105, the second layer of the gate insulating layer, the semiconductor layer, the source electrode and the drain electrodes are transfer printed onto the top of the first layer of the gate insulating layer by a transfer printing process.

As mentioned in the above embodiments, the gate insulating layer is made into a structure having an upper layer and a lower layer through the nano-imprinting and transfer printing technology in the above steps. Also, the two layers or parts of the gate insulating layer are contacted and connected through the protruding structures. As such, the capacitance of the detection apparatus prepared can change based on an external pressure, thereby achieving the same effect for the detection apparatus as mentioned in the above embodiments.

Figure 6:
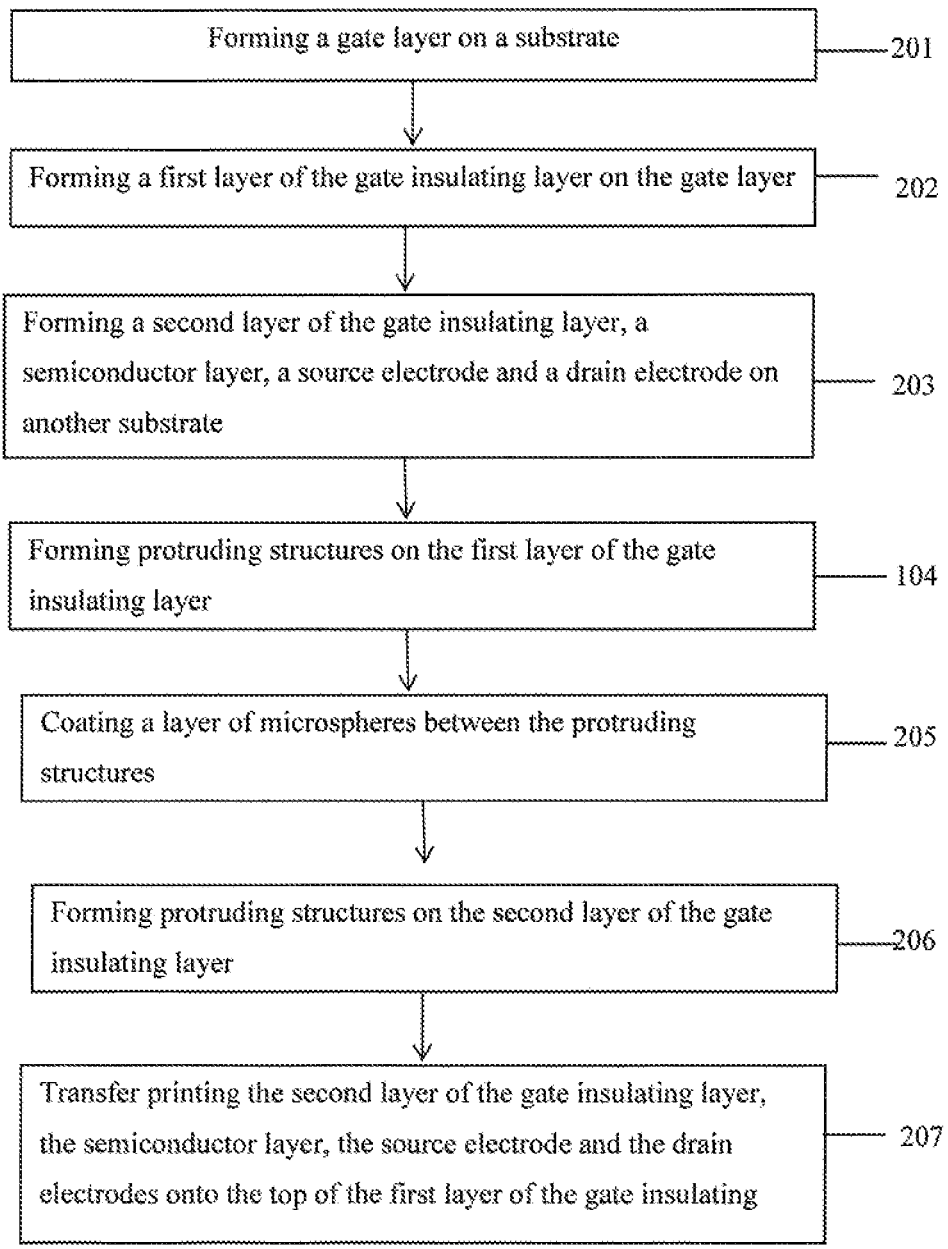
FIG. 6 is a flow chart of a method of fabricating a detection apparatus according to an embodiment of the present disclosure.

FIG. 6 is a flow chart of a method of fabricating a detection apparatus according to an embodiment of the present disclosure.

In step 201, a gate layer (gate) is prepared on a substrate. The gate electrode of the TFT is connected with the external control voltage $V_{GS}$ to achieve the corresponding control function.

In step 202, a first layer of the gate insulating layer is prepared on the gate layer. In some embodiments, the first layer of the gate insulating layer can be obtained by coating or spin coating;

In step 203, a second layer of the gate insulating layer, a semiconductor layer, a source electrode and a drain electrode are prepared on another substrate.

In step 204, protruding structures are formed on the first layer of the gate insulating layer through a nano-imprinting process. In some embodiments, the protruding structures are the same as those structures shown in FIG. 2 and FIG. 3.

In step 205, a layer of microspheres is coated between the protruding structures on the first layer of the gate insulating layer.

In step 206, protruding structures are formed on the second layer of the gate insulating layer through the nano-imprinting process. In some embodiments, the protruding structure is an arc-shaped protruding structure formed between adjacent arcs and is matched with the size of the microspheres.

In step 207, the second layer of the gate insulating layer, the semiconductor layer, the source electrode, and the drain electrode are transfer printed to the first layer of the gate insulating layer by a transfer printing process.

As such, the gate insulating layer with the microsphere structures can be prepared so that the detection apparatus according to one embodiment of the present disclosure can be prepared.

In the embodiments, specific sequence of the steps of the flow chart in FIG. 6 is not limited herein, and can be correspondingly adjusted according to actual requirements. For example, after the first layer of the gate insulating layer is prepared in step 202, step 204 can be directly performed, that is protruding structures are prepared on the first layer of the gate insulating layer through a nano-imprinting process. Then, the coating of micro-spheres is carried out subsequently, that is, the step 205 is carried out. After that, the step 203 of preparing the second layer of the gate insulating layer, the semiconductor layer, the source electrode and the drain electrode, the step 206, and the step 207 are carried out.

In some embodiments, the detection apparatus is a pressure sensor or a temperature sensor.

Figure 7:
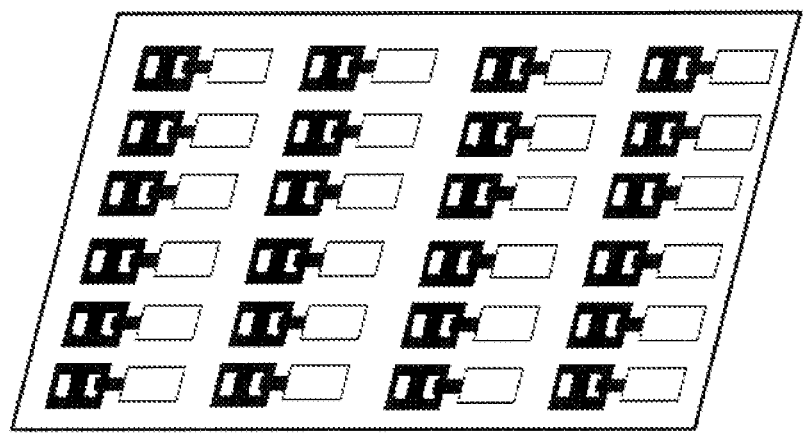
FIG. 7 is a schematic structural diagram of an array of a detection apparatus according to an embodiment of the present disclosure.

Pressure sensors are commonly used sensors in industrial practice and are widely used in various industrial self-control environments. The existing pressure sensors are force sensors, such as a piezoresistive pressure sensor and a capacitive type pressure sensor. Detecting the amount of the pressure is realized by converting a pressure signal into an electric signal. In the embodiments of the present disclosure, the capacitance of the gate insulating layer of the detection apparatus is changed through the pressure, so that the pressure can change the current between the source electrode and the drain electrode. When the detection apparatus is applied in the relevant field of the OLED displays, by detecting the change of the current between the source electrode and the drain electrode or the change of the brightness of the OLED, the detection apparatus can detect the change of the pressure. In addition, utilizing the flexible characteristics of the Organic thin-film transistor (OTFT) and the OLED, as shown in FIG. 7, the detection apparatuses can be arranged in an array structure. The detection apparatus can be attached to the surface of skin for monitoring heartbeats and pulses, thereby achieving the advantages of being light, thin and convenient to carry. That is, the detection apparatus is attached to skin surface as a sensor. Then, by detecting changes of the corresponding current, the detection apparatus can detect the change of the pressure applied to the detection apparatuses. As such, the change of heart beats pulses can be correspondingly detected.

An array substrate is provided according to one embodiment of the present disclosure. The array substrate includes the detection apparatus according to any one of the embodiments mentioned above.

Furthermore, a display apparatus is provided according to one embodiment of the present disclosure. The display apparatus includes the array substrate according to one embodiment of the present disclosure.

In one embodiment, without being held to a particular theory, when the detection apparatus is applied to the related technical fields of displays, the working principle of the detection apparatus is as follows:

First, according to a capacitance calculation formula $C=\varepsilon S/4\pi kd$, wherein $\varepsilon$ is a relative dielectric constant, s is the area between the two electrode plates right facing each other, k is a static electric constant, d is the distance between the two electrode plates. For the detection apparatus of the present disclosure, under a stimulation of an external pressure or temperature, the relative dielectric constant of the capacitance or the distance between the electrodes can be changed, that is, the capacitance is changed. According to the formulas of the $I_{DS}$ linear region $$I_{DS} = \frac{W}{L} C_{i\mu}(V_{GS} - V_{TH})V_{DS}$$

and the $I_{DS}$ saturation region $$I_{DS} = \frac{W}{2L} C_{i\mu}(V_{GS} - V_{TH})^2,$$

the current between the source electrode and the source drain electrode changes when the capacitance changes. According to the signal amplification effect of the TFT, the change of the current is reflected on the change of the brightness of the AMOLED. Therefore, the pressure detection can be achieved through the current detection of the detection apparatus or the brightness monitoring of the OLED. That is, the detection apparatus can be used as a micro pressure sensor. In some other embodiments, due to the flexible characteristics of the OTFT and of the OLED, the detection apparatuses are arranged in an array structure for monitoring changes of heart beats or pulses in the field of electronic skin.

In some embodiments, When the detection apparatus mentioned above is used as a micro pressure sensor, without being held to a particular theory, the process of changing the capacitance through the pressure is as follows: under an action of a small pressure, the protruding structures are compressed so that the contact area between the two layers of the gate insulating layer is increased. Meanwhile, the distance between the two layers of the gate insulation layer is also reduced. The capacitance is accordingly increased. Since the capacitance is increased, the current between the source electrode and the drain electrode is also increased. Further, the change of the current and the change of the brightness are based on the Current-Voltage-Luminance (IVL) curve of the OLED. The Current-Voltage (IV) curve in the OLED reflects an exponential relationship. Different currents correspond to different voltages, and different voltages correspond to different brightness. When the current is changed, the corresponding brightness is changed. When the detection apparatus presented by the present disclosure is applied to an OLED, the detection parameter is not limited to brightness, and can be a change of various parameters such as efficiency, External Quantum Efficiency (EQE), etc.

In some embodiments, when the detection apparatus is used for a temperature self-enhanced display, without being held to a particular theory, the principle is the following: heat generated in the OLED display process can increase the temperature. Under the effect of the temperature change, the microspheres in the detection apparatus are expanded so that the relative dielectric constant is increased, thereby increasing the capacitance and the current between the source electrode and the drain electrode. As such, the display light source is self-enhanced.

It should be understood by one of ordinary skill in the art that the discussion of any of the above embodiments is merely exemplary, and is not intended to imply that the scope of the present disclosure (including the claims) is limited to these examples. In the concept of the disclosure, the above embodiment or the technical features of different embodiments can also be combined, and the steps can be implemented in any order. Also, there are many other variations of the various aspects of the present disclosure as described above. They are not provided in detail for the sake of brevity.

In addition, in order to simplify the description and discussion, and in order not to obscure the present disclosure, and the known power supply/grounding connection of the chips and other components of the Integrated Circuit (IC) can be shown or not shown in the provided figures. In addition, the apparatus can be shown in a block diagram form, so as to avoid the problem that the present disclosure is difficult to understand. The following facts are also considered, that is, the details of the embodiments of these block diagrams are highly dependent on the platform that the embodiments will be used on (that is, the details should be completely within the range of those skilled in the art). Under the condition that specific details (e.g., circuits) are described as an exemplary embodiment of the present disclosure, it will be apparent to those skilled in the art that the present disclosure can be practiced without describing these specific details or with changes in these specific details. Accordingly, the description is to be regarded as illustrative rather than restrictive.

Although the present disclosure has been described with reference to specific embodiments thereof, but according to the foregoing description, many alternatives, modifications, and variations of these embodiments are apparent to those of ordinary skill in the art. For example, other memory architectures (e.g., Dynamic Random-Access Memory DRAM) may be used in the above embodiments.

The principles and the embodiments of the disclosure are set forth in the specification. The description of the embodiments of the present disclosure is only used to help understand the method of the present disclosure and the core idea thereof. Meanwhile, for a person of ordinary skill in the art, the disclosure relates to the scope of the disclosure, and the technical scheme is not limited to the specific combination of the technical features, and also should cover other technical schemes which are formed by combining the technical features or the equivalent features of the technical features without departing from the inventive concept. For example, technical scheme may be obtained by replacing the features described above as disclosed in this disclosure (but not limited to) with similar features.

What is claimed is:

1. A detection apparatus, comprising:
   a gate insulating layer comprising at least a first layer and a second layer opposite the first layer,
   wherein a plurality of protruding structures are provided on a surface of the first layer facing the second layer or a surface of the second layer facing the first layer, and the first layer and the second layer of the gate insulating layer are connected through the plurality of the protruding structures; and
   a plurality of microspheres are provided between the first layer and the second layer of the gate insulating layer, the plurality of the protruding structures form cavities between the first layer and the second layer of the gate insulating layer, and the cavities accommodate the plurality of the microspheres.

2. The detection apparatus according to claim 1, further comprising
   a substrate;
   a gate electrode on the substrate;
   a semiconductor layer;
   a source electrode; and
   a drain electrode;

wherein the gate insulating layer is between the semiconductor layer and the gate electrode, and the source electrode and the drain electrode are respectively connected with the semiconductor layer.

3. The detection apparatus according to claim 1, wherein the plurality of the protruding structures are provided on both the surface of the first layer facing the second layer and the surface of the second layer facing the first layer in the gate insulating layer.

4. The detection apparatus according to claim 2, wherein a cross section of each of the plurality of the protruding structures in a plane perpendicular to the substrate has a triangular shape.

5. The detection apparatus according to claim 2, wherein a cross section of each of the plurality of the protruding structures in a plane perpendicular to the substrate is an arc-shaped protruding structure formed between two adjacent arcs.

6. The detection apparatus according to claim 1, wherein the first layer and the second layer are connected through the plurality of the protruding structures and the plurality of the microspheres.

7. The detection apparatus according to claim 5, wherein the plurality of the microspheres are provided between the first layer and the second layer of the gate insulating layer, the plurality of the protruding structures provided on both the surface of the first layer facing the second layer and the surface of the second layer facing the first layer in the gate insulating layer form spaces accommodating the plurality of the microspheres.

8. The detection apparatus according to claim 7, wherein the plurality of the microspheres are made of polystyrene.

9. The detection apparatus according to claim 7, wherein a height of each of the plurality of the protruding structures is substantially equal to a diameter of each of the plurality of the microspheres.

10. The detection apparatus according to claim 1, wherein the plurality of the protruding structures are made of an elastic polymer.

11. The detection apparatus according to claim 10, wherein the elastic polymer is selected from the group consisting of PS, PMMA, PS-P2VP block polymers, and mixtures thereof.

12. An array substrate comprising the detection apparatus according to claim 1.

13. A display apparatus comprising the array substrate according to claim 12.

* * * * *